Ｕnited States Patent [19]

Johnson

[11] Patent Number: 4,987,473
[45] Date of Patent: Jan. 22, 1991

[54] LEADFRAME SYSTEM WITH MULTI-TIER LEADS
[75] Inventor: Dean P. Johnson, Cupertino, Calif.
[73] Assignee: VLSI Technology, Inc., San Jose, Calif.
[21] Appl. No.: 389,038
[22] Filed: Aug. 3, 1989
[51] Int. Cl.⁵ .................. H01L 23/48; H01L 23/54
[52] U.S. Cl. ................................................ 357/70
[58] Field of Search ......................... 357/70, 68, 69; 174/52.4

[56] References Cited
U.S. PATENT DOCUMENTS 4,323,293 4/1982 DeRouen et al. ................... 357/70
4,766,478 8/1988 Dennis .................................. 357/70
4,796,078 1/1989 Phelps, Jr. et al. ................. 357/70

Primary Examiner—Rolf Hille
Assistant Examiner—S. V. Clark
Attorney, Agent, or Firm—Majestic, Parsons, Siebert & Hsue

[57] ABSTRACT

The leadframe of this invention includes a die attach pad and leads with lead tips in the vicinity of the pad. Alternate lead tips have been bent upwards into one plane and the remaining lead tips are bent downwards into a different plane. This design enables a denser packing of lead tips without fear of electrical shorts than the conventional design where the lead tips are in the same plane.

6 Claims, 3 Drawing Sheets

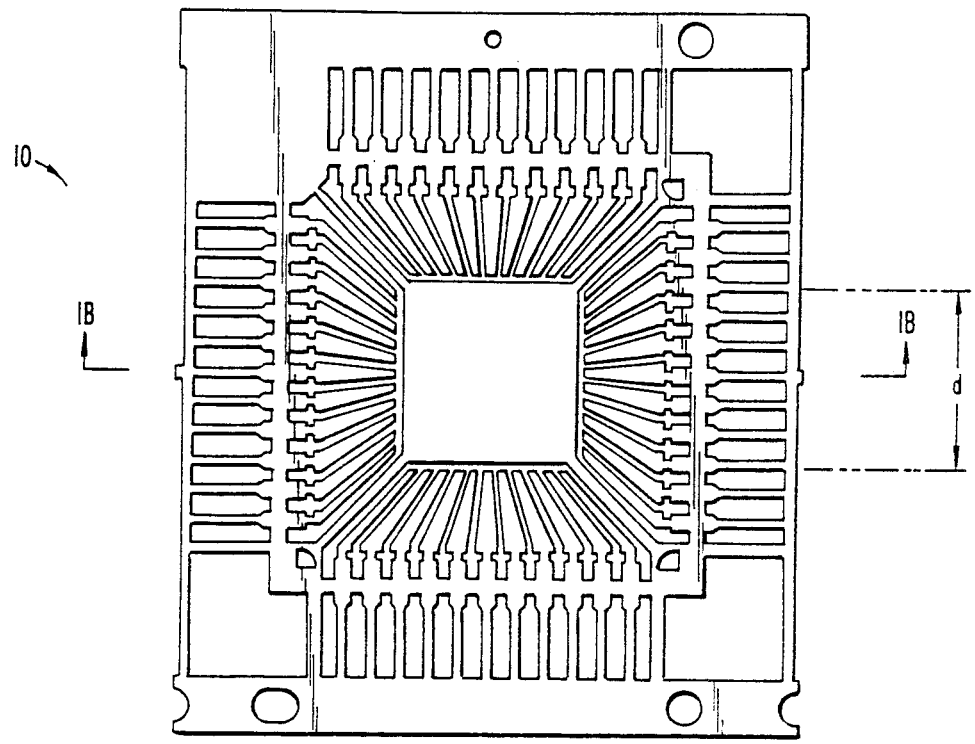
FIG._1A.
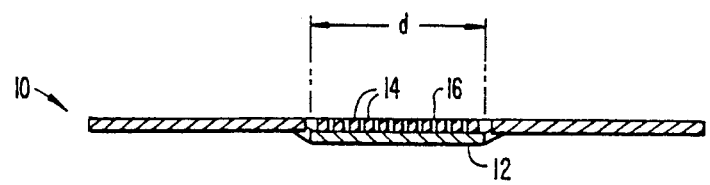
FIG._1B.

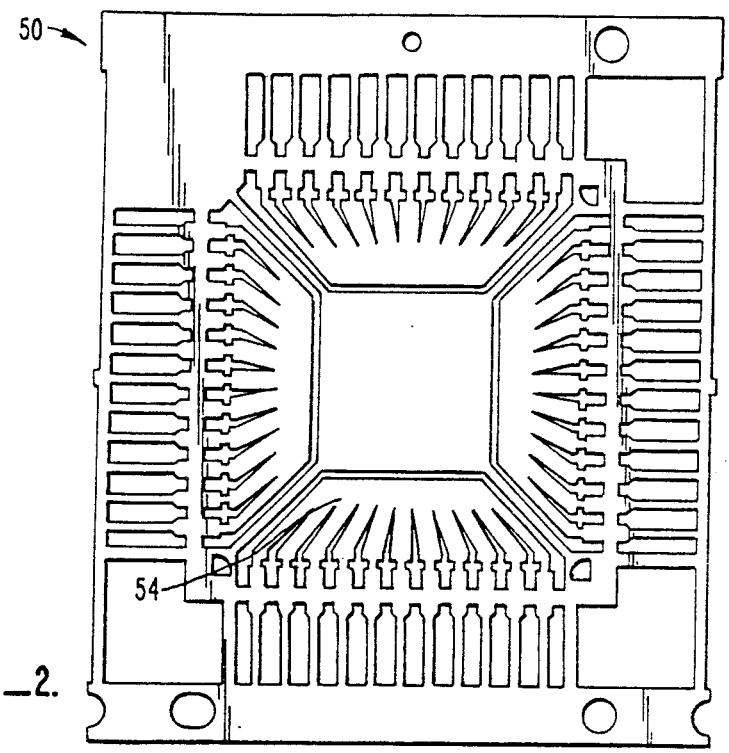
FIG._2.
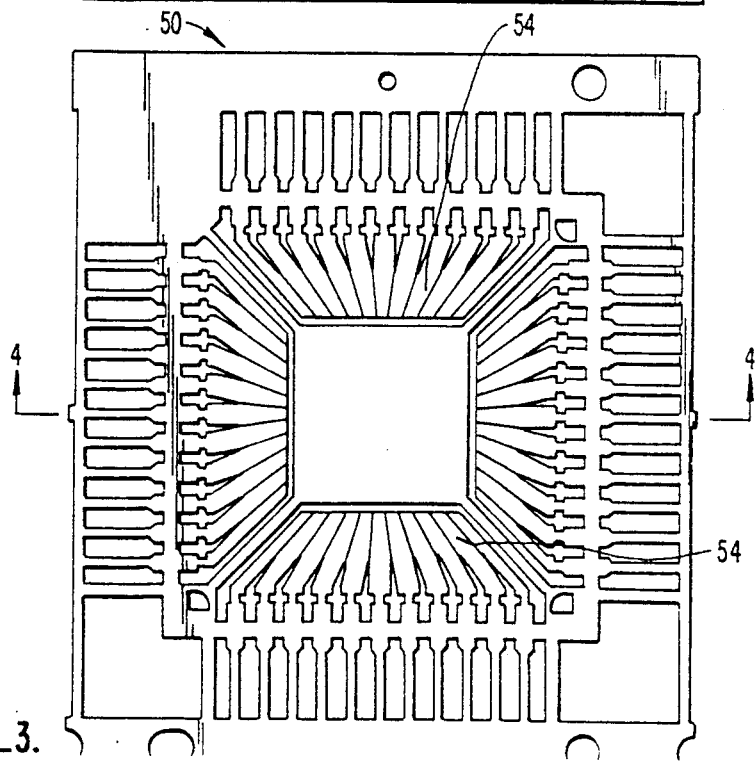
FIG._3.

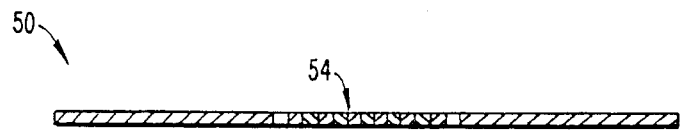
FIG._4.
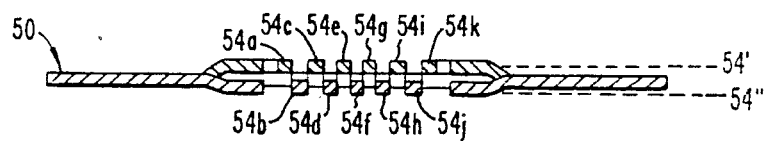
FIG._5.
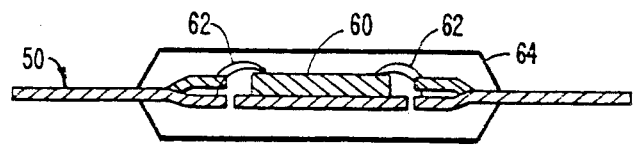
FIG._6.

LEADFRAME SYSTEM WITH MULTI-TIER LEADS

BACKGROUND OF THE INVENTION

This invention relates in general to semiconductor packaging and in particular to a leadframe with multi-tier leads.

With the development of very large scale integration technology, the size of the die used in semiconductor packages is continually being reduced. Even though the size of the die is reduced, it will be desirable to retain the capability of providing a large number of pins connected to each side of the die. In semiconductor packages employing leadframes, the die is supported by a die attach pad which forms a portion of the leadframe. The leadframe also has leads with lead tips close to the die for connecting selected points on the die to pins which extend outside the package.

The lead tips are typically close to the die so that bonding wires with lengths within an optimal range may be used for bonding the lead tips to the die. After wire bonding, the die, the die attach pad, the bonding wires and the lead tips are all enclosed by a molding material such as by plastic in an injection molding process. When the size of the die is reduced, and if the dimensions of the leadframe used for supporting the die remains the same, the edges of the die would be further apart from the lead tips. In such event, longer bonding wires would be required to bond the die to the lead tips.

The use of bonding wires whose lengths are longer than the optimal is undesirable since this would increase the stress at the portions of the wire where it is bonded to the die and to the lead tip, thereby increasing the probability of a faulty wire bonding connection. The alternative is to modify the leadframe by making the die attach pad smaller and by bringing the lead tips further inward towards the die so that bonding wires of optimal length can again be used to bond the die to the lead tips. In such case, the current state of the art leadframe design imposes a limit as to how close the lead tips can be brought towards the center of the die attach pad without having to reduce the number of leads provided for each side of the die as explained below.

The leadframe is made as follows. A flat sheet of metal is stamped to cut out portions of the sheet so that the portions remaining form the leadframe. In order to make individual leads, an essentially parallel array of thin slices of the sheet are cut out in the stamping process so that the long finger-shaped portions remaining form the leads. Alternatively, these slices can be removed in an etching process. In the current leadframe design, all the lead tips are in the same plane. A minimum spacing must be maintained between the lead tips to avoid electrical shorts.

In the current state of the art in stamping or etching technology, there are certain limits as to how small the width of the leads and as to how small the spaces between the leads can be. Therefore if the number of leads that are to be connected to each side of the die by wire bonds is to remain the same, the "design width" of spaces required between the lead tips in the current state of stamping or etching technology limits how close the leads can get to the die and the center of the die attach pad. This forces a designer to choose between reducing the number of leads that can be connected to each side of a die and using bonding wires that are longer than optimal. Either alternative is undesirable.

It is therefore desirable to provide a new leadframe system in which the above-described difficulties are alleviated.

SUMMARY OF THE INVENTION

The package of this invention is for holding a semiconductor die. The package comprises a leadframe including a die attach pad and leads with lead tips in the vicinity of the pad, and means for electrically connecting the lead tips to selected points on the die. The lead tips are in two or more different planes. The package further includes a body enclosing portions of the leadframe and the connecting means to fix the positions of the die attach pad, the lead tips and the connecting means.

The method of this invention is for packaging a semiconductor die employing a leadframe with a die attach pad and leads whose tips in the vicinity of the pad are connected. The method comprises slitting the connections so that the lead tips are not connected to one another and bending the leads so that their tips are in different planes and so that they are spaced apart from one another to prevent electrical shorts. The method further comprises attaching the die to the die attach pad, wire bonding the die to one or more of the lead tips and enclosing the pad, die and lead tips in a molding material to fix the positions of the pad, lead tips and die.

BRIEF DESCRIPTION OF THE DRAWINGS

FIG. 1A is a top view of a conventional leadframe.

FIG. 1B is a cross-sectional view of the leadframe of FIG. 1A with a downset die attach pad.

FIG. 2 is a top view of a leadframe before slitting to illustrate a preferred embodiment of the invention.

FIG. 3 is a top view of the leadframe after slitting to illustrate the preferred embodiment.

FIG. 4 is a cross-sectional view of the leadframe of FIG. 3 across the line 4-4 in FIG. 3 but with a die attach pad removed and before bending.

FIG. 5 is a cross-sectional view of the leadframe of FIG. 4 after bending.

FIG. 6 is a cross-sectional view of the leadframe of FIG. 5 with the die attach pad and die and bonding wires connecting the die and lead tips, and of a body enclosing these elements.

DETAILED DESCRIPTION OF THE INVENTION

FIG. 1A is a top view of a conventional leadframe 10. FIG. 1B is a cross-sectional or cutaway view of leadframe 10 of FIG. 1A along the line 1B—1B where the die attach pad 12 is downset. Leadframe 10 is made by stamping or etching all the unwanted portions from a flat thin sheet of metal, leaving a leadframe of configuration such as that shown in FIG. 1A. Preferably the die attach pad is downset to facilitate the centering of the die on the pad. The pad is substantially square in shape with side of length d as shown in FIGS. 1A, 1B.

If the die to be supported by pad 12 is not much smaller than the pad so that the edges of the die when supported by the pad are within short distances from the lead tips 14, bonding wires of optimal lengths may be used for bonding. However, if the size of the die is reduced so that it is much smaller than d, the bonding wires necessary to connect the die to tips 14 may exceed the optimal range and is undesirable.

One solution is to reduce the size of the pad so that its side is significantly shorter than d. While this does permit the lead tips to extend further inward toward the pad center so that bonding wires of optimal length can again be used, such modification creates another problem.

As better shown in FIG. 1B, the lead tips 14 are all in the same plane and adjacent lead tips 14 are separated by a spacing 16. Current state of the art stamping and etching technology requires that a certain minimum "design width" must be maintained between adjacent lead tips. This limits the number of lead tips that can be stamped or etched across the distance d opposite the die attach pad. As shown in FIG. 1B, if spacing 16 is the minimum "design width" between adjacent lead tips and the width of tips 14 is the minimum permitted by the current state of the art stamping or etching technology, the length d of the leadframe can contain only eleven lead tips. Therefore, if the size of the pad is reduced so that its side is significantly shorter than d, the number of leads that can be accommodated within such shorter distance must be correspondingly reduced. Otherwise, the adjacent leads may contact each other to create electrical shorts.

Therefore, the conventional leadframe design where the lead tips are all in the same plane forces a designer to choose between two undesirable alternatives: reducing the number of leads that can be connected to the die or using bonding wires that are too long.

This invention is based on the observation that, in the example described above, the limitation that the eleven leads of FIG. 1B must be spread over at least distance d is the case only if the lead tips 14 are in the same plane, where spacing 16 is required between adjacent tips. If these leads are placed in different planes, a larger number of leads than eleven can be spread over the same distance d, or alternatively, the same number of leads may be moved closer to the center of the pad without fear of electrical shorts, thereby permitting the size of the pad to be reduced for accommodating small dies. This effectively increases the density of lead tips that can be brought close to the die while permitting optimal length bonding wires to be used.

FIGS. 2 and 3 are top views of a leadframe before and after slitting to illustrate the preferred embodiment of the invention. Leadframe 50 of FIG. 2 differs from leadframe 10 of FIG. 1A in that the lead tips 14 are connected after the stamping or etching step. Even after slitting, the lead tips are still in contact as shown in FIG. 3. For simplicity, identical parts in the figures of this application are identified by the same numerals.

FIG. 4 is a cross-sectional view along the line 4—4 in FIG. 3 where the die attach pad has been removed to show more clearly the positions of the lead tips. As shown in FIG. 4, leadframe 50 at this stage is in a single plane, including the lead tips 54. Alternate lead tips are then bent upwards and the remaining lead tips are bent downwards so that a cross-sectional view of leadframe 50 taken along the line 4—4 in FIG. 3 after bending will look like that in FIG. 5. As shown in FIG. 5, lead tips 54a, 54c, 54e, 54g, 54i and 54k are bent upwards and are in plane 54' and leads 54b, 54d, 54f, 54h and 54j are bent downwards and are in plane 54". Even though adjacent lead tips among the eleven lead tips are in contact with each other while they are coplanar as shown in FIG. 4, they are no longer in contact with each other as shown in FIG. 5, but are separated by a spacing depending on the amount the lead tips are bent as shown in FIG. 5. To more clearly illustrate the positions of the lead tips, the die attach pad and die are omitted in FIGS. 4 and 5.

Comparing the preferred embodiments in FIGS. 4 and 5 and the conventional leadframe in FIG. 1B, it will be evident that the eleven lead tips 54 can be accommodated over a shorter length in the leadframe 50 of FIGS. 2-6 compared to leads 14 in FIG. 1B. To be exact, the minimum "design width" 16 otherwise required to be maintained between adjacent lead tips 14 in the conventional design may now be eliminated in the design of FIGS. 4 and 5 when the lead tips are coplanar before bending. FIG. 6 shows lead frame 50 with a die attach pad and die 60 and bonding wires 62 connecting the die and individual lead tips as well as a body of molding material 64 enclosing the lead tips, bonding wires, die attach pad and the die to fix the position of these components in place and to shield these components from the outside environment.

While in the preferred embodiment illustrated in FIGS. 5 and 6, the lead tips are in two different planes, 54', 54", it will be understood that the leads may be bent into more than two planes; all such variations are within the scope of the invention. While all the leads are described as bent, it will be understood that, in other designs, only some of the leads need to be bent. For example, the same lead tip density can be achieved by bending only leads 54a, 54c, 54e, 54g, 54i and 54k without bending leads 54b, 54d, 54f, 54h and 54j or vice versa. All such variations are within the scope of the invention.

As shown in FIG. 6, the die attach pad 12 is downset. In the preferred embodiment, the bending step of the lead tips may be performed when the die attach pad is downset. Thus, the method for making the leadframe with multi-tier leads in the preferred embodiment is as follows. First, a flat thin sheet of metal is stamped or etched to yield leadframe 50 in the form shown in FIG. 2. At such stage, the lead tips 54 are still connected. In the next stage of the process, the lead tips are split to become individual lead tips as shown in FIG. 3. Adjacent lead tips are still in contact. Then the die attach pad is downset and at the same time the lead tips are bent into the form shown in FIG. 5. The die 60 is then attached to the die attach pad 12 and bonding wires 62 are used to connect the lead tips and the die. The lead tips, bonding wires, die and die attach pad are then enclosed in the body 64 to fix these components in place to prevent them from being contaminated by the outside environment. The package is then completed.

While in the preferred embodiment, the bending of the lead tips is performed in the downsetting step, it will be understood that the bending step may be performed at other stages of the packaging process as well. Thus, the bending step may be performed during the first stamping step for making frame 50 as shown in FIG. 2. In such event, the stamping step will also slit the lead tips from each other and bend the lead tips at the same time.

It is also possible to postpone the bending step until after the downsetting step and after the bonding wires are in place. Such alternative method may be undesirable since the bending step would subject the leadframe to severe stress and shock. Such stress and shock may undermine the integrity of the wire bonding. It is also possible to perform the bending step as a separate step before or after the downsetting step has been performed. However, this increases the number of steps of processing that the leadframe should undergo and therefore increases the chance of rejects. The invention has been illustrated above in reference to particular implementations and specific process steps. It will be understood, however, that the implementation and the process may be varied and modified without departing from the invention whose scope is to be limited only by the appended claims.

I claim:

1. A package for holding a semiconductor die of a predetermined size, comprising:
   a unitary leadframe including a die attach pad and leads with lead tips in the vicinity of the pad, said leads being an integral part of the unitary leadframe;
   means for electrically connecting said lead tips to selected points on said die, said tips being in two or more different planes; and
   a body enclosing said leadframe, the die and the connecting means to fix the positions of the leadframe and the connecting means relative to the die, said leads being so located relative to the die attach pad that when the die is supported by the die attach pad, and when the die, the leads and connecting means are fixed in position by the body, the tips of the leads are spaced apart from the die.

2. The package of claim 1, wherein the distance between the lead tips is less than about 500 mils.

3. The package of claim 1, wherein the lead tips ar substantially in two different planes.

4. The package of claim 3, wherein the lead tips are arranged in at least one row, wherein the first lead tip in the row and alternate lead tips in the row from the first are substantially in a first plane, and wherein the second lead tip in the row and alternate lead tips in the row from the second are substantially in a second plane different from the first plane.

5. The package of claim 1, wherein the leads are originally connected at or near the tips, and wherein in a packaging process the connections between the tips are slit and the tips bent so that they are in different planes.

6. The package of claim 1, wherein said die has two sides, said connecting means connecting said lead tips to selected points all on one side of the die.

* * * * *